United States Patent
Hazucha et al.

(10) Patent No.: US 7,262,632 B2
(45) Date of Patent: Aug. 28, 2007

(54) SIGNAL MEASUREMENT SYSTEMS AND METHODS

(75) Inventors: Peter Hazucha, Beaverton, OR (US); Gerhard Schrom, Hillsboro, OR (US); Tanay Karnik, Portland, OR (US); Vivek K De, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 125 days.

(21) Appl. No.: 11/095,951

(22) Filed: Mar. 31, 2005

(65) Prior Publication Data

US 2006/0220677 A1  Oct. 5, 2006

(51) Int. Cl.
*H03K 19/173* (2006.01)
*G06F 7/38* (2006.01)

(52) U.S. Cl. .................. 326/38; 326/82; 327/407

(58) Field of Classification Search .............. 326/16, 326/37, 38, 82, 105; 327/7, 17, 407
See application file for complete search history.

(56) References Cited

U.S. PATENT DOCUMENTS

| | | | |
|---|---|---|---|
| 5,744,991 A * | 4/1998 | Jefferson et al. | 327/158 |
| 6,788,101 B1 * | 9/2004 | Rahman | 326/30 |

* cited by examiner

*Primary Examiner*—Daniel Chang
(74) *Attorney, Agent, or Firm*—Jung-hua Kuo

(57) ABSTRACT

Systems and methods are disclosed for measuring signals on an integrated circuit die. In one embodiment, a reference signal is distributed to die locations proximal to the signals to be measured. The reference signal is transmitted over transport paths coupling each of the signals to be measured to the die output. The signals to be measured are transmitted over their respective transport paths and measured at the die output. The relative delay between the signals can be calculated using the reference signal measurements.

19 Claims, 5 Drawing Sheets

SIGNAL MEASUREMENT SYSTEMS AND METHODS

BACKGROUND

As microprocessors and other integrated circuits become denser and faster and rely on lower operating voltages, increased demands are placed on these circuits' power distribution systems. For example, the use of reduced voltages and increased currents can degrade the stability of the supply voltage for circuits like microprocessors. Designers have explored a variety of techniques to mitigate these effects, including the use of increased decoupling capacitance, sophisticated low-resistance packages, and direct-current-to-direct-current (DC-DC) converters. Many efficient DC-DC converters make use of zero-voltage switching (ZVS) and zero-current switching (ZCS) techniques, and rely on the ability to accurately time the switching characteristics of large power metal oxide semiconductor field effect transistors (MOSFETs).

BRIEF DESCRIPTION OF THE DRAWINGS

Reference will be made to the following drawings, in which.

DESCRIPTION OF SPECIFIC EMBODIMENTS

Systems and methods are disclosed for performing relatively accurate measurements of signals on an integrated circuit die. It should be appreciated that these systems and methods can be implemented in numerous ways, several examples of which are described below. The following description is presented to enable any person skilled in the art to make and use the inventive body of work. The general principles defined herein may be applied to other embodiments and applications. Descriptions of specific embodiments and applications are thus provided only as examples, and various modifications will be readily apparent to those skilled in the art. Accordingly, the following description is to be accorded the widest scope, encompassing numerous alternatives, modifications, and equivalents. For purposes of clarity, technical material that is known in the art has not been described in detail so as not to unnecessarily obscure the inventive body of work.

Figure 1:
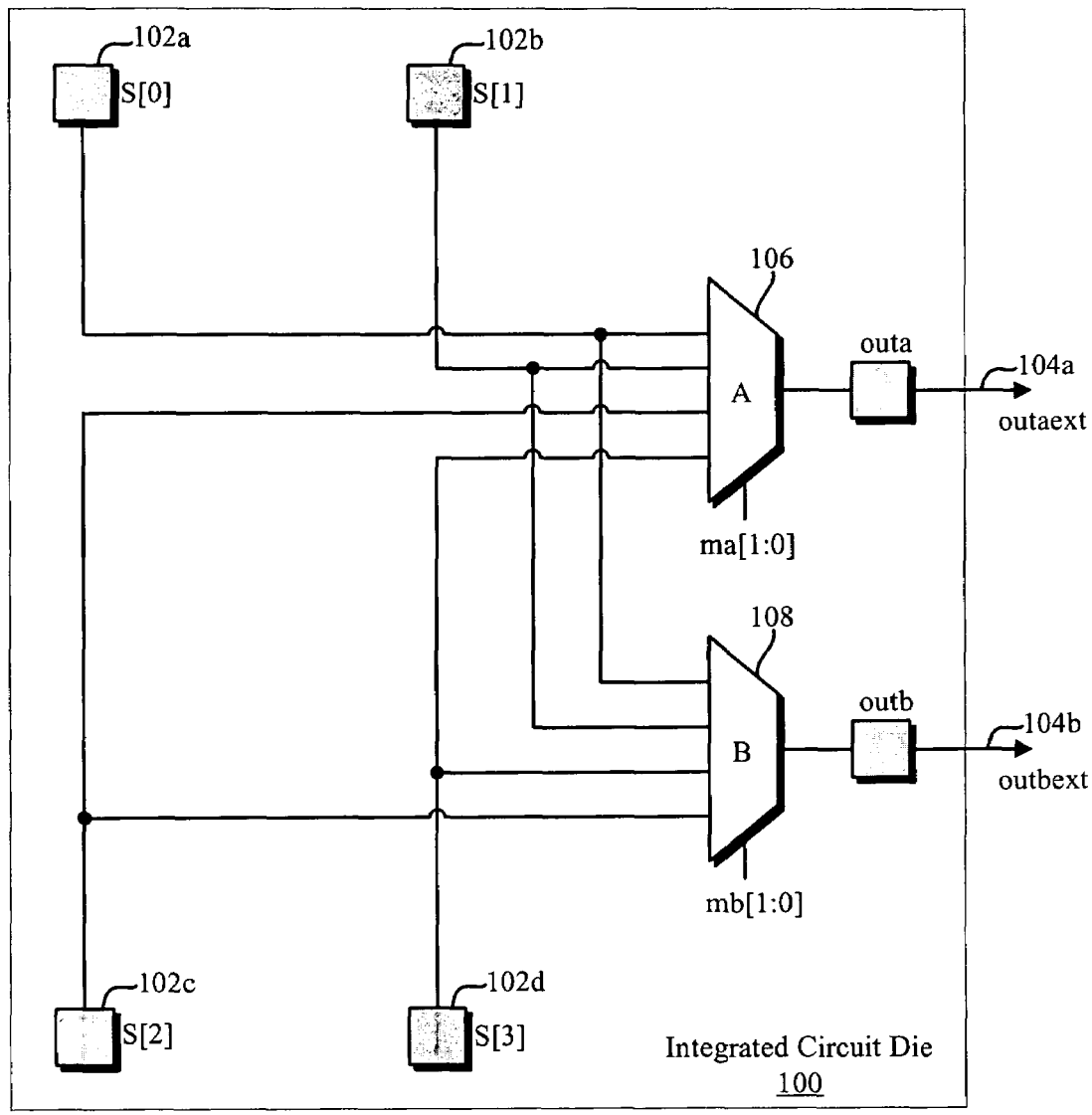
FIG. 1 is an illustration of a system for measuring the delay between signals on an integrated circuit.

FIG. 1 illustrates the problem of determining the relative delay (or "skew") between two or more signals, S[0]-S[3], on a circuit or integrated circuit die 100 by measuring the signals off of the die. One way to make such a measurement is to simply connect each of the signals directly to a separate external connection 104a, 104b, such as a pad or a pin. If the number of signals is large, multiplexers 106, 108 can be used to select the desired signals, as shown in FIG. 1. For simplicity, only four signals, S[0]-S[3] are shown in FIG. 1; however, any number of signals could be used, and these signals could originate from any location on the die, without restriction on their spatial arrangement.

Referring once again to FIG. 1, the process of measuring the relative skew between two signals could proceed as follows. First, multiplexer 106 would select one of the signals S[0] through S[3], and multiplexer 108 would select the other signal S[0] through S[3] to be measured. The selected signals would appear at off-die outputs outaext 104a and outbext 104b, respectively, and their relative delay could be measured using, e.g., an oscilloscope.

A problem with the approach shown in FIG. 1, however, is that the on-die version of a signal and the off-die version of the same signal will typically differ due to the transport delay from the signal's on-die point of origin 102a-d to the external location at which the signal is measured 104. This transport delay will often be unknown and/or not well-controlled. As a result, if signals S[0] through S[3] do not originate from the same location on the die, the transport delay from the on-die signal source to the external probe may not be the same for each signal. Any difference in transport delays will add to (or subtract from) the actual skew between the signals at their respective points of origin, resulting in an inaccurate skew measurement. Although the portion of the transport delay after multiplexers 106 and 108 can be eliminated if the same signal is fed to both multiplexers, the difference in transport delays on the die and introduced by the multiplexers themselves would remain unaccounted for. Thus, this method may not be useful when transport delays are comparable to (or greater than) the measured skew.

Figure 2:
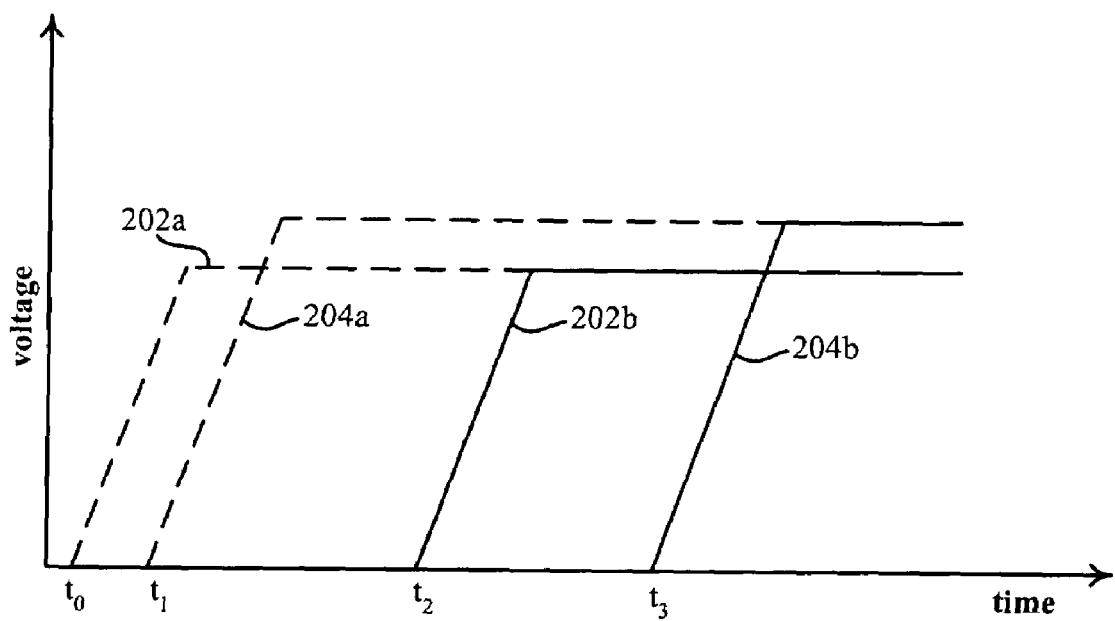
FIG. 2 is an illustration of two skewed signals.

FIG. 2 illustrates two skewed signals, and shows how unequal transport delays can compromise the accuracy of an attempt to make an off-die measurement of the on-die skew. As shown in FIG. 2, signals 202a and 204a (shown in dashed lines) are only skewed by $t_1-t_0$ nanoseconds (ns) on-die. However, when measured off-die, delayed versions of signals 202 and 204 (i.e., signals 202b and 204b, respectively) are skewed by $t_3-t_2$ ns, which is greater than $t_1-t_0$ ns. The reason for this is that the transport delay—that is, the time needed for a signal to travel from its on-die point of origin (or the point at which it is to be measured) to the off-die measurement site—is larger for signal 204 than the transport delay experienced by signal 202 (i.e., $t_3-t_1 > t_2-t_0$).

One potential solution to this problem would be to design the integrated circuit die 100 such that the transport delay of each of the signals S[0] through S[3] was substantially equal to the transport delay of the other signals. This may prove difficult, however, if the number of signals is large. Adding to the difficulty is the fact that multiplexers (such as multiplexers 106, 108) with a large number of inputs often do not delay each input equally.

It should be appreciated that FIG. 2 is provided for purposes of illustration, and not limitation, and that a number of modifications could be made without departing from the principles that are illustrated therein. For example, although in FIG. 2 the skew between signals 202 and 204 was calculated by subtracting the time at which signal 202 began to rise (e.g., time $t_2$) from the time at which signal 204 began to rise (e.g., time $t_3$), it should be appreciated that the skew between signals 202 and 204 could be calculated in any suitable manner, such as by subtracting the midpoints of their respective rising edges, or the like. In addition, while for ease of illustration signals 202 and 204 are shown having different amplitudes, it will be appreciated that signals having the same amplitude or any relative amplitude could be measured.

Figure 3:
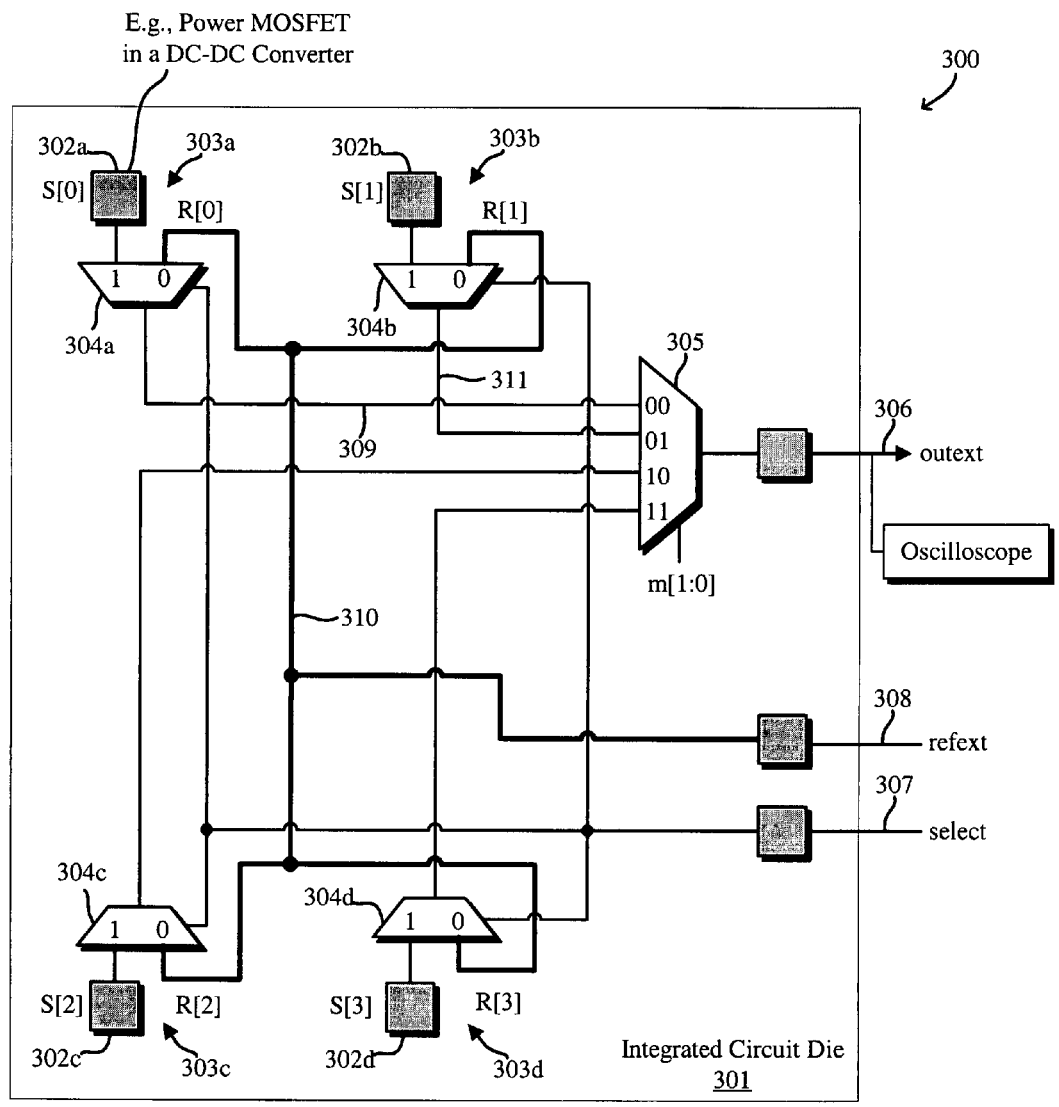
FIG. 3 is an illustration of an improved embodiment for measuring the delay between signals on an integrated circuit.

FIG. 3 shows an improved arrangement 300 for measuring signal skew. The arrangement shown in FIG. 3 may not be as sensitive to transport delay mismatch as the embodiment shown in FIG. 1. In the embodiment shown in FIG. 3, a low-skew reference signal 310 generated by an external reference clock, or other reference signal generator, is distributed on an integrated circuit die 301 with low skew. That is, the low-skew reference signal 310 is distributed across the die such that it is substantially the same at all points on the die (e.g., R[0]=R[1]=R[2]=R[3]=refext). It should be appreciated that such a reference signal generator can be implemented in any suitable manner. For example, if the circuit is a microprocessor, the microprocessor's clock could be used, as the clock is generally distributed over the integrated circuit die with low skew. If such a reference signal is not already available in the circuit, it can be readily added using, e.g., standard techniques for clock distribution, such as H-tree networks, and/or the like.

As shown in FIG. 3, the low-skew reference signal 310 is routed to on-die locations 303a-303d proximal to each of the signals to be measured (S[0]-S[3]). In the example shown in FIG. 3, the low-skew reference signal 310 is routed as an input to multiplexers 304a-304d, each of which includes one of the signals to be measured as its other input. The delay experienced by a signal traveling from one of the multiplexers 304 to the die output outext 306 can be measured by transmitting the reference signal over this transport path and comparing the resulting delayed version of the reference signal, as seen at die output outext 306, with the original reference signal, as seen at die input/output 308. Because the low-skew reference signal 310 is distributed throughout the die in a low-skew fashion, there will be minimal skew between the version of the reference signal seen at input/output 308 and the version seen at the inputs of multiplexers 304. Having calculated the transport delay of a signal traveling from a multiplexer 304 to die output outext 306, this transport delay can be subtracted from the externally measured version of a signal, S, traveling over the same path, thus yielding a measurement of the signal, S, as it existed at its point of origin, e.g., an on-die signal source such as at die location 302a-d.

It will be appreciated that the accuracy of this measurement will depend in part on the proximity of the multiplexers 304 to the die locations 302a-d at which the signals S[0]-S[3] are to be measured. Thus, in one embodiment the multiplexers 304 are placed proximal to the point of origin (die locations 302a-d) of the signals to be measured, such that the amount of time needed for a signal to reach the multiplexer's input is much less than the delay experienced by the signal when traveling from the multiplexer's input to the die output outext 306. The skew measurement technique described in connection with FIG. 3 also assumes that the input-output delays for the two inputs of the two-way multiplexers 304 are substantially equal, or at least that any difference is much less than the transport delay of the remainder of the path from each multiplexer 304 to output outext 306. It will be appreciated that this assumption can be readily satisfied with a variety of multiplexer designs, any suitable one or more of which could be used.

As an example of how the circuit shown in FIG. 3 could be used to measure the relative skew between two signals, assume it is desired to measure the skew of S[0] to S[1]. First, multiplexer 305 is programmed to select the output of multiplexer 304a. This can be accomplished by setting multiplexer 305's selection input bits, m[1:0], to 00. Signal select 307 is set to zero, causing reference clock R[0] to appear at the output of multiplexer 304a, from which it will travel over transport path 309 to an off-die measurement site, e.g., at die output outext 306. The transport delay, $\Delta t_0$, of R[0] over path 309 is then measured by subtracting the original (undelayed) version of the reference signal, as seen at refext 308, from the delayed version of R[0], as seen at die output outext 306. That is, $\Delta t_0$=DT0−refext−r'; where DT0 is the delayed version of R[0] as measured at die output outext 306, and r' is the path delay from refext to multiplexer 304a. Since the low-skew reference signal, R, 310 is assumed to be distributed with low skew, R[0] will be substantially equal to refext, and thus r' will be much less than the other quantities in the equation and can be ignored.

Similarly, the transport delay, $\Delta t_1$, of R[1] over path 311 can be measured by programming multiplexer 305 to select the output of multiplexer 304b (i.e., by setting multiplexer 305's selection inputs to 01), and by setting signal select 307 to zero, causing reference clock R[1] to appear at the output of multiplexer 304b and to travel over transport path 311 to off-die measurement die site, e.g., output outext 306. The transport delay, $\Delta t_1$, of R[1] over path 311 is then calculated by subtracting the original (undelayed) version of the reference signal, as seen at refext 308, from the delayed version of R[1], as seen at die output outext 306.

Next, delayed versions of signals S[0] and S[1]—i.e., DS0 and DS1, respectively—are measured using an oscilloscope coupled, e.g., connected, to an off-die measurement site, e.g., die output outext 306. This can be accomplished by setting the selection input 307 of multiplexers 304 to one, thus causing multiplexers 304a and 304b to pass signals S[0] and S[1] to their respective outputs. As before, the selection bits, m[1:0], of multiplexer 305 are set to 00 to select the output of multiplexer 304a, and then to 01 to select the output of multiplexer 304b, thus allowing successive measurements of DS0 and DS1, respectively, at die output outext 306. These measurements can be stored in the oscilloscope's memory for use in further calculations. The final skew of S[0] to S[1] can then be calculated as (DS0−$\Delta t_0$)−(DS1−$\Delta t_1$), where (DS0−$\Delta t_0$) is an approximation of the original signal S[0], and (DS1−$\Delta t_1$) is an approximation of the original signal S[1].

It should be appreciated that FIG. 3 is provided for purposes of illustration, and not limitation, and that a number of modifications could be made without departing from the principles that are illustrated therein. For example, the calculation of relative skew can be conceptualized and/or carried out in any suitable fashion by, e.g., rearranging the equation (DS0−$\Delta t_0$)−(DS1—$\Delta t_1$) to equivalent forms, and/or by taking other measurements that yield an equivalent result. For example, without limitation, an equivalent measurement of the skew between S[0] and S[1] could be obtained by simply subtracting DT0 and DT1 directly from DS0 and DS1, respectively, without performing an intermediate calculation of $\Delta t_0$ and $\Delta t_1$. The final skew of S[0] to S[1] would thus be computed as (DS0−DT0)−(DS1−DT1), where (DS0−DT0) is the skew of S[0] to R[0], and (DS1−DT1) is the skew of S[1] to R[1]. Since R[0] and R[1] are assumed to be synchronized, the difference (DS0−DT0)—(DS1−DT1) yields the skew of S[0] to S[1]. The equivalence between (DS0−DT0)—(DS1−DT1) and (DS0−$\Delta t_0$)−(DS1−$\Delta t_1$) can be seen by substituting DT0-refext for $\Delta t_0$, and DT1-refext for $\Delta t_1$.

As yet another example, the skew between S[0] and S[1] could be equivalently expressed by first measuring (or calculating) the mismatch in transport delays between the two signal paths (i.e., DT0−DT1), then subtracting this mismatch from DS0, and finally subtracting DS1 from the result. It can be seen that the resulting expression for the skew—S[0]−S[1]=(DS0−(DT0−DT1)−DS1)—is equivalent to the equations previously described, and can be obtained by simply rearranging the terms. Thus it should be appreciated that the skew between two signals S[0] and S[1] can be computed or conceptualized in the manner described above or in any equivalent manner.

The calculated relative skew between two signals may be used to adjust one or more aspects of the signal source for one or both signals to, for example, reduce the relative skew between the two signals. As another example, the calculated relative skew between two signals may be used to adjust one or more aspects of a transport path of one or both signals to, for example, reduce the relative skew between the two signals.

Figure 4:
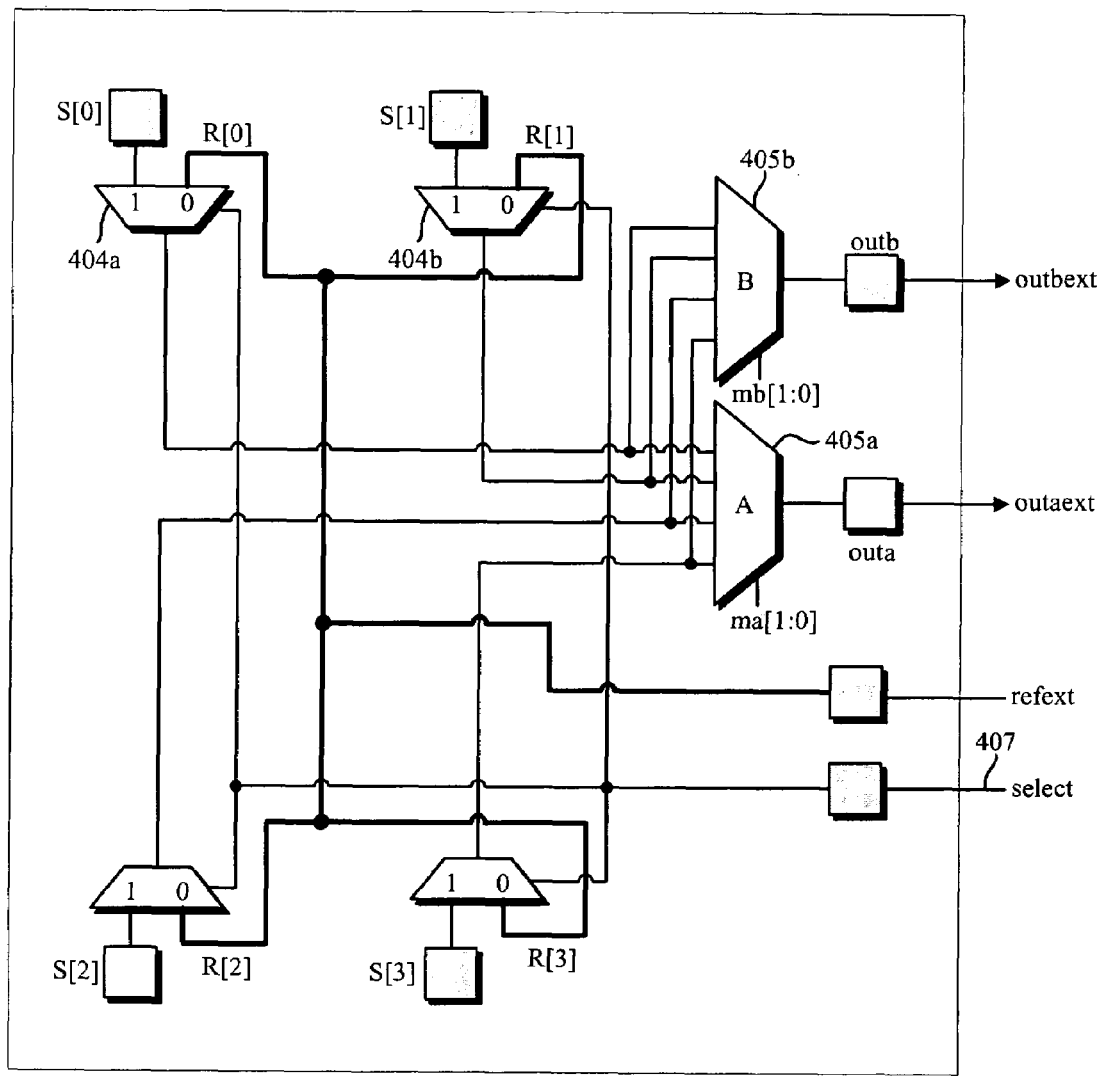
FIG. 4 is another illustration of an improved embodiment for measuring the delay between signals on an integrated circuit.

FIG. 4 is a variation of the circuit shown in FIG. 3 that allows simultaneous probing of two signals. This can be convenient if the measurement is performed by, e.g., an oscilloscope with multiple probes. Assume that the skew of S[0] and S[1] is to be measured. First, R[0] is fed to outaext and R[1] is fed to outbext by setting the select input 407 of multiplexers 404a and 404b to zero, and the selection bits of multiplexers 405a and 405b to 00 and 01, respectively. The resulting delayed versions of R[0] and R[1] (i.e., DT0 and DT1) are then measured with an oscilloscope coupled to outaext and outbext, from which the relative transport delay, DT01, between the delayed versions of R[0] and R[1] can be observed. Next, the select input 407 of multiplexers 404a and 404b is set to one, causing signals S[0] and S[1] to be fed to outaext and outbext, respectively. The relative delay, DS01, between the delayed versions of S[0] and S[1] can then be measured, and the skew between S[0] and S[1] can be determined as DS01−DT01.

An advantage of the method shown in FIG. 4 is that it enables simultaneous viewing of multiple signals and their relative skew using a device such as an oscilloscope. Suppose that it is desired to repetitively measure and tune the skew. The method in FIG. 4 entails only a single measurement of DT01. Some oscilloscopes, such as, e.g., the TEK-TDS-7404 oscilloscope manufactured by Tektronix Inc. of Beaverton, Or., allow the user to skew the viewed inputs with respect to each other by changing the oscilloscope setting. This feature can be used to set the apparent DT01 to zero. Then, after reprogramming of the multiplexers to feed signals S[0] and S[1] to their respective outputs, the user can directly observe the skew of S[0] and S[1].

It should be appreciated that FIGS. 3 and 4 are provided for purposes of illustration, and not limitation, and that a number of modifications could be made without departing from the principles that are illustrated therein. For example, although four signals, S[0]−S[3], are shown in FIGS. 3 and 4, it should be appreciated that any number of signals (e.g., 8, 10, 16, 32, etc.) could be accommodated by substituting multiplexers 305, 405 with multiplexers with additional inputs. Similarly, it should be appreciated that the principles illustrated in FIGS. 3 and 4 could be readily extended to enable simultaneous viewing of more than two signals. For example, by adding additional multiplexers similar to multiplexers 405a, 405b in FIG. 4, the outputs of additional signals S[2]−S[n] could be viewed. Moreover, although several examples have been presented in which an oscilloscope is used to measure various signals, it should be appreciated that any suitable oscilloscope or other measurement tool can be used.

Figure 5:
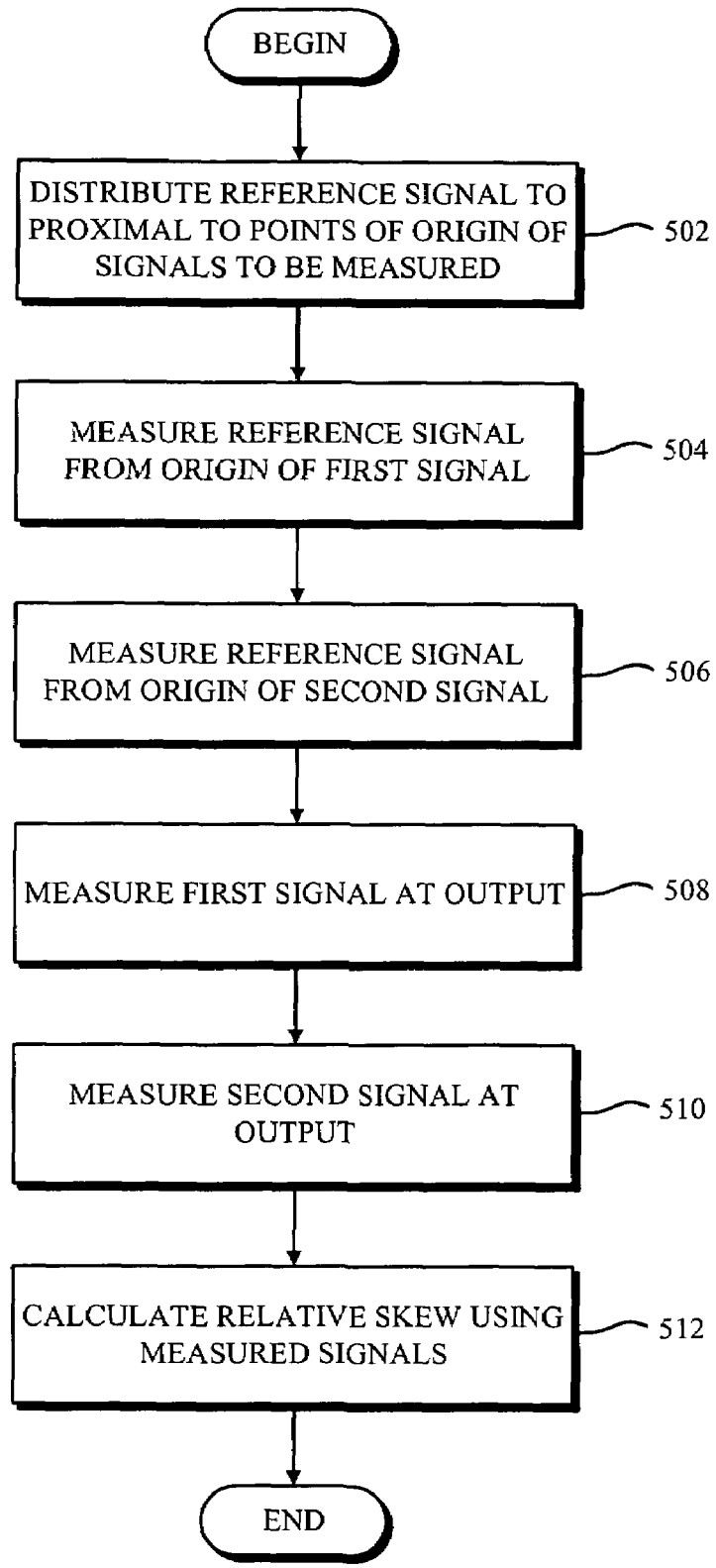
FIG. 5 is an illustration of a method for measuring the relative delay between two signals using circuits such as those shown in FIGS. 3 and 4.

FIG. 5 is an illustration of a method for measuring the relative on-die skew between two signals using a circuit such as those shown in FIGS. 3 and 4. A reference signal such as a low-skew reference signal is routed to on-die locations proximal to each signal to be measured (e.g., the input of a multiplexer that has one of the signals to be measured as its other input) (block 502). The reference signal can be measured from the origin of the first and second signals (blocks 504, 506). For example, the transport delay of the reference signal from the point of origin of the first signal to be measured to the die output can be measured (block 504), as is the transport delay of the reference signal from the point of origin of the second signal to the die output (block 506). The first signal is then measured at the die output (block 508), as is the second signal (block 510). The relative skew may then be calculated using the measured signals (block 512), e.g., the skew between the two signals can be calculated using the transport delay measurements obtained at blocks 504 and 506. For example, the transport delays computed at blocks 504 and 506 can be subtracted from the first and second signals, respectively, to obtain close approximations of the signals as they existed at their respective points of origin, from which the skew between the two signals can be readily calculated or observed.

Thus, embodiments of the systems and methods described herein can be used to enable the measurement of one or more signals on an integrated circuit die, and the relative delay between such signals. In many cases the existing on-die clock can be used as the reference signal and no further matching of delays is needed.

Embodiments of the systems and methods described herein can thus be used for a wide variety of purposes and in a wide variety of applications. For example, embodiments of the systems and methods described herein can be used to facilitate the measurement and tuning of the relative delay between the turn-on and turn-off signals of power MOSFETs in DC-DC converter applications, thus facilitating the accurate timing of switching instants, and an evaluation of the efficiency of zero voltage switching. It should be appreciated, however, that the circuits and techniques described herein could be used to measure one or more signals for any suitable purpose.

Thus, while several embodiments are described and illustrated herein, it will be appreciated that they are merely illustrative. Accordingly, other embodiments are within the scope of the following claims.

What is claimed is:

1. A system comprising:
   a first on-die signal source;
   a second on-die signal source;
   a network operable to distribute a reference signal to a die location proximal to the first on-die signal source and to a die location proximal to the second on-die signal source;
   a first signal transport path coupling the first on-die signal source and the reference signal to a first die output;
   a second signal transport path coupling the second on-die signal source and the reference signal to a second die output;
   a first multiplexer located proximal to the first on-die signal source, the first multiplexer being configured to select between a signal from the first on-die signal source and the reference signal;
   a second multiplexer located proximal to the second on-die signal source, the second multiplexer being configured to select between a signal from the second on-die signal source and the reference signal; and
   a third multiplexer configured to select between an output of the first multiplexer and an output of the second multiplexer, the third multiplexer having an output coupled to the first die output.

2. The system of claim 1, wherein the reference signal is a low-skew reference signal.

3. The system of claim 1, comprising:
a fourth multiplexer configured to select between an output of the first multiplexer and an output of the second multiplexer, the fourth multiplexer having an output coupled to the second die output.

4. The system of claim 1, further comprising:
a plurality of additional on-die signal sources, wherein the network is further operable to distribute the reference signal to die locations proximal to each of the plurality of additional on-die signal sources; and
a plurality of additional signal transport paths coupling each of the plurality of additional on-die signal sources and the reference signal to the first die output and/or the second die output.

5. The system of claim 4, comprising:
a plurality of additional multiplexers, each configured to select between a respective one of the plurality of additional signals and the reference signal;
wherein the third multiplexer is configured to select between the output of the first multiplexer, the output of the second multiplexer, and the respective outputs of the plurality of additional multiplexers.

6. The system of claim 5, comprising:
a fourth multiplexer configured to select between an output of the first multiplexer, an output of the second multiplexer, and the respective outputs of the plurality of additional multiplexers.

7. The system of claim 1, in which the first on-die signal source comprises a power MOSFET.

8. The system of claim 1, in which the first die output is the same as the second die output.

9. A method comprising:
measuring a first delayed version of a reference signal, the first delayed version of the reference signal having traveled from a first chip location;
measuring a second delayed version of the reference signal, the second delayed version of the reference signal having traveled from a second chip location;
measuring a first signal originating from a location proximal to the first chip location;
measuring a second signal originating from a location proximal to the second chip location;
calculating a relative skew between the first signal and the second signal using, at least in part, the first delayed version of the reference signal and the second delayed version of the reference signal;
selecting between a first signal originating from a location proximal to the first chip location and the reference signal at a first multiplexer;
selecting between a second signal originating from a location proximal to the second chip location and the reference signal at a second multiplexer; and
selecting between an output of the first multiplexer and an output of the second multiplexer at a third multiplexer.

10. The method of claim 9, in which calculating the relative skew between the first signal and the second signal comprises:
calculating a relative transport delay by subtracting the second delayed version of the reference signal from the first delayed version of the reference signal; and
subtracting, from the first signal, the second signal and the relative transport delay.

11. The method of claim 9, in which the reference signal comprises a system clock.

12. The method of claim 9, in which the first signal and the second signal comprise switching characteristics of first and second power MOSFETs in a DC-DC converter.

13. The method of claim 9, in which the actions are performed in the order recited.

14. The method of claim 9, in which an oscilloscope is used in measuring the first signal and in measuring the second signal.

15. The method of claim 9, further comprising:
adjusting at least one aspect of a source of the first signal in response to calculating the relative skew, the adjusting being designed to reduce the relative skew between the first signal and the second signal.

16. The method of claim 9, further comprising:
adjusting at least one aspect of a transport path of the first signal between the first chip location and a first output in response to calculating the relative skew, the adjusting being designed to reduce the relative skew between the first signal and the second signal.

17. A system comprising:
a first on-die signal source;
a second on-die signal source;
a network operable to distribute a reference signal to a die location proximal to the first on-die signal source and to a die location proximal to the second on-die signal source;
a first signal transport path coupling the first on-die signal source and the reference signal to a first die output;
a second signal transport path coupling the second on-die signal source and the reference signal to a second die output;
an oscilloscope operable to measure a signal at the first die output and a signal at the second die output;
a first multiplexer configured to select between a first signal at the first on-die signal source and the reference signal;
a second multiplexer configured to select between a second signal at the second on-die signal source and the reference signal; and
a third multiplexer configured to select between an output of the first multiplexer and an output of the second multiplexer, the third multiplexer having an output coupled to the first die output.

18. The system of claim 17, wherein is a reference signal is a low-skew reference signal.

19. The system of claim 17, comprising:
a fourth multiplexer configured to select between an output of the first multiplexer and an output of the second multiplexer, the fourth multiplexer having an output coupled to the second die output.

* * * * *